(12) United States Patent
Wu

(10) Patent No.: US 8,835,197 B2
(45) Date of Patent: Sep. 16, 2014

(54) ACTIVE MATRIX ORGANIC LIGHT-EMITTING DIODE AND MANUFACTURING METHOD THEREOF

(71) Applicant: Shenzhen China Star Optoelectronics Technology Co., Ltd., Shenzhen (CN)

(72) Inventor: Yuanchun Wu, Shenzhen (CN)

(73) Assignee: Shenzhen China Star Optoelectronics Technology Co., Ltd., Shenzhen, Guangdong Province (CN)

( * ) Notice: Subject to any disclaimer, the term of this patent is extended or adjusted under 35 U.S.C. 154(b) by 45 days.

(21) Appl. No.: 13/806,728

(22) PCT Filed: Oct. 10, 2012

(86) PCT No.: PCT/CN2012/082662
§ 371 (c)(1),
(2), (4) Date: Dec. 21, 2012

(87) PCT Pub. No.: WO2014/047964
PCT Pub. Date: Apr. 3, 2014

(65) Prior Publication Data
US 2014/0117319 A1    May 1, 2014

(30) Foreign Application Priority Data

Sep. 26, 2012  (CN) .......................... 2012 1 0363741

(51) Int. Cl.
*H01L 21/00* (2006.01)
*H01L 31/112* (2006.01)

(52) U.S. Cl.
USPC ............................................ 438/24; 257/257

(58) Field of Classification Search
USPC .................................. 257/72, 83, 225, 257, 257/E33.056–E33.059; 438/24, 48
See application file for complete search history.

(56) References Cited

U.S. PATENT DOCUMENTS 7,164,230 B2 * 1/2007 Park .............................. 313/505

FOREIGN PATENT DOCUMENTS

CN           1468037 A      1/2004
CN         102569665 A      7/2012

* cited by examiner

Primary Examiner — Calvin Lee
(74) Attorney, Agent, or Firm — Cheng-Ju Chiang

(57) ABSTRACT

The present invention provides an active matrix organic light-emitting diode and a manufacturing method thereof. The active matrix organic light-emitting diode includes an organic light-emitting diode body and a thin-film transistor electrically connected to the organic light-emitting diode body. The thin-film transistor is formed on a substrate and includes semiconductor layer formed on the substrate, a gate insulation layer formed on the semiconductor layer, a gate terminal formed on the gate insulation layer, a protection layer formed on the gate terminal, and a source terminal and a drain terminal formed on the protection layer. The light-emitting diode body includes an anode formed on the protection layer and electrically connected to the thin-film transistor, an organic light emission layer formed on the anode, and a cathode formed on the organic light emission layer. The organic light-emitting diode body is arranged to be positioned above the thin-film transistor in an alternate manner.

10 Claims, 5 Drawing Sheets

ACTIVE MATRIX ORGANIC LIGHT-EMITTING DIODE AND MANUFACTURING METHOD THEREOF

BACKGROUND OF THE INVENTION

1. Field of the Invention

The present invention relates to the field of organic light-emitting diode, and in particular to an active matrix organic light-emitting diode and a manufacturing method thereof.

2. The Related Arts

An organic light-emitting diode or organic light-emitting diode display (OLED) is also referred to as an organic electroluminescent diode, which is a novel displaying technology of which the development was dated back to the middle of the 20th century. The organic electroluminescent diode has various advantages over a liquid crystal display, such as being fully solid state, active emission of light, high brightness, high contrast, being ultra thin, low cost, low power consumption, fast response, wide view angle, wide range of operation temperature, and being capable of flexible displaying. The structure of an organic electroluminescent diode generally comprises a substrate, an anode, a cathode, and an organic function layer and the principle of light emission is that multiple layers of organic materials that are of extremely small thickness is formed between the anode and the cathode through vapor deposition, whereby positive and negative carriers, when injected into the organic semiconductor films, re-combine with each other to generate light. The organic function layer of the organic electroluminescent diode is generally made up of three function layers, which are respectively a hole transport layer (HTL), an emissive layer (EML), and an electron transport layer (ETL). Each of the function layers can be a single layer or more than one layer. For example, the hole transport layer sometimes is further divided into a hole injection layer and a hole transport layer and the electron transport layer may also be divided into an electron transport layer and an electron injection layer. However, they are of substantially the same function and are thus collectively referred to as the hole transport layer and the electron transport layer.

Currently, the manufacture of a full color organic electroluminescent diode is generally done with three methods, which are RGB juxtaposition and individual emission method, white light in combination with color filter method, and color conversion method, among which the RGB juxtaposition and individual emission method is most promising and has the most practical applications. The manufacturing method thereof is that red, green, and blue use different subject and object light-emitting materials.

The organic light-emitting diodes can be classified in two types, according to the method of driving, which are active driving and passive driving, namely direct addressing and TFT (Thin-Film Transistor) matrix addressing. The active driving type organic light-emitting diode is the so called active matrix organic light-emitting diode (AMOLED). Referring to FIGS. 1 and 2, an active matrix organic light-emitting diode comprises a substrate 100, a TFT array 300 arranged on the substrate 100, and an organic light-emitting diode body 500 arranged above the TFT array 300 and electrically connected to the TFT array 300, and an insulation layer 700 arranged between the TFT array 300 and the organic light-emitting diodes body 500 and is usually composed of a structure of 8-12 layers. The greater the number of the layers is, the more complicated the manufacturing process will be and the greater the number of masks used. And, the manufacturing efficiency and product quality are getting worse and the manufacturing cost is getting higher. Further, an excessively large area occupied by a storage capacitor also reduces the aperture ratio of a pixel unit. Thus, the manufacturing method of an active matrix organic light-emitting diode must be further improved.

SUMMARY OF THE INVENTION

An object of the present invention is to provide an active matrix organic light-emitting diode, which has a simple process of manufacturing and low cost and provides a large aperture ratio.

Another object of the present invention is to provide a manufacturing method of an active matrix organic light-emitting diode, which simplifies the manufacturing process, reduces the manufacturing cost, and improves manufacturing efficiency and product quality.

To achieve the objects, the present invention provides an active matrix organic light-emitting diode, which comprises: an organic light-emitting diode body and a thin-film transistor electrically connected to the organic light-emitting diode body, the thin-film transistor being formed on a substrate and comprising a semiconductor layer formed on the substrate, a gate insulation layer formed on the semiconductor layer, a gate terminal formed on the gate insulation layer, a protection layer formed on the gate terminal, and a source terminal and a drain terminal formed on the protection layer. The light-emitting diode body comprises an anode formed on the protection layer and electrically connected to the thin-film transistor, an organic light emission layer formed on the anode, and a cathode formed on the organic light emission layer. The organic light-emitting diode body is arranged to be positioned above the thin-film transistor in an alternate manner.

The gate terminal is formed of a first metal layer through a masking process. The source terminal and the drain terminal are formed of a second metal layer through a masking process. The anode of the organic light-emitting diode body is formed of a transparent conductive layer through a masking process.

The transparent conductive layer comprises an indium tin oxide layer.

The substrate comprises a glass or plastic substrate.

The masking process comprises exposure, development, and etching operations.

The present invention also provides an active matrix organic light-emitting diode, which comprises: an organic light-emitting diode body and a thin-film transistor electrically connected to the organic light-emitting diode body, the thin-film transistor being formed on a substrate and comprising a semiconductor layer formed on the substrate, a gate insulation layer formed on the semiconductor layer, a gate terminal formed on the gate insulation layer, a protection layer formed on the gate terminal, and a source terminal and a drain terminal formed on the protection layer, the light-emitting diode body comprising an anode formed on the protection layer and electrically connected to the thin-film transistor, an organic light emission layer formed on the anode, and a cathode formed on the organic light emission layer, the organic light-emitting diode body being arranged to be positioned above the thin-film transistor in an alternate manner;

wherein the gate terminal is formed of a first metal layer through a masking process, the source terminal and the drain terminal being formed of a second metal layer through a masking process, the anode of the organic light-emitting diode body being formed of a transparent conductive layer through a masking process;

wherein the transparent conductive layer comprises an indium tin oxide layer;

wherein the substrate comprises a glass or plastic substrate; and wherein the masking process comprises exposure, development, and etching operations.

The present invention also provides a manufacturing method of an active matrix organic light-emitting diode, which comprises the following steps:

(1) providing a substrate;

(2) forming a semiconductor layer on the substrate;

(3) forming a gate insulation layer on the semiconductor layer;

(4) forming a first metal layer on the gate insulation layer and applying a masking process to form a gate terminal;

(5) forming a protection layer on the gate terminal;

(6) sequentially forming a transparent conductive layer and a second metal layer on the protection layer and applying a masking process to define a metal conductive zone and a light emission zone, wherein the second metal layer forms a source terminal and a drain terminal in the metal conductive zone and the transparent conductive layer forms an anode of the organic light-emitting diode body in the light emission zone, the anode being electrically connected to the drain terminal; and (7) forming a light emission layer and a cathode of the organic light-emitting diode body on the anode of the organic light-emitting diode body thereby forming an active matrix organic light-emitting diode.

The substrate comprises a glass or plastic substrate.

The masking process comprises exposure, development, and etching operations.

The transparent conductive layer comprises an indium tin oxide layer.

The efficacy of the present invention is that the present invention provides an active matrix organic light-emitting diode and a manufacturing method thereof, which carries out successive coating of a transparent conductive layer and a second metal layer and applies two masking processes to respectively form the source terminal and the drain terminal of TFT array and an anode of the organic light-emitting diode body, thereby defining a metal conductive zone and a light emission zone, whereby one insulation layer is saved, the number of masks used is reduced, the manufacturing efficiency of active matrix organic light-emitting diode is increased, and the manufacturing cost is reduced. Further, the aperture ratio is effectively enlarged so as to improve the quality of active matrix organic light-emitting diode.

For better understanding of the features and technical contents of the present invention, reference will be made to the following detailed description of the present invention and the attached drawings. However, the drawings are provided for the purposes of reference and illustration and are not intended to impose undue limitations to the present invention.

BRIEF DESCRIPTION OF THE DRAWINGS

The technical solution, as well as beneficial advantages, of the present invention will be apparent from the following detailed description of an embodiment of the present invention, with reference to the attached drawings. In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
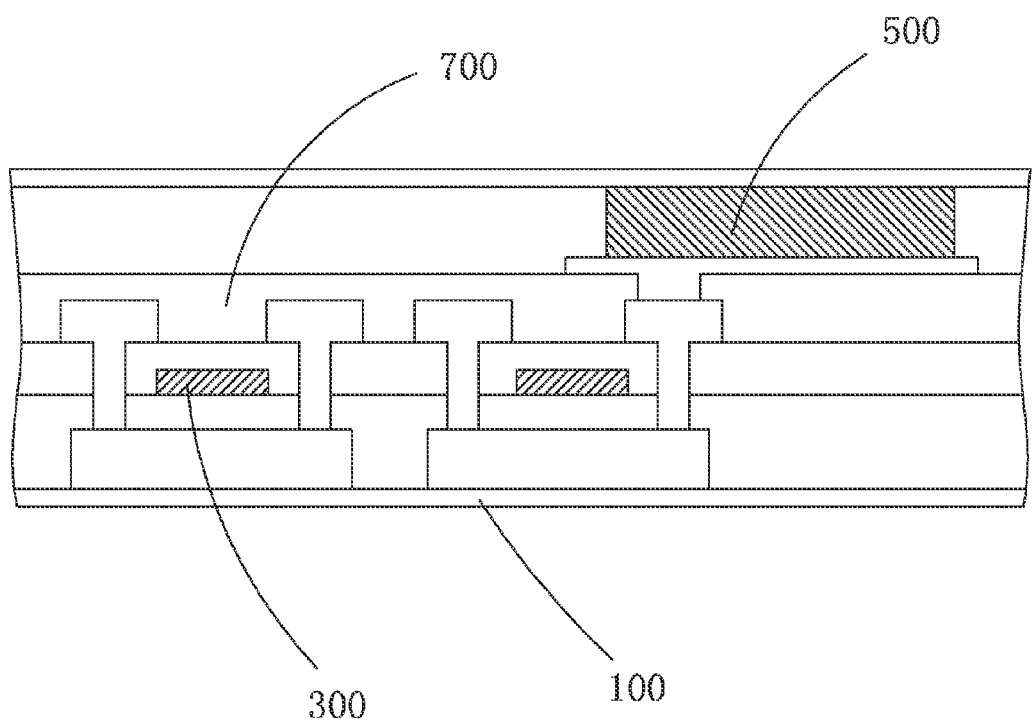
FIG. 1 is a schematic view showing the structure of a conventional active matrix organic light-emitting diode.
Figure 2:
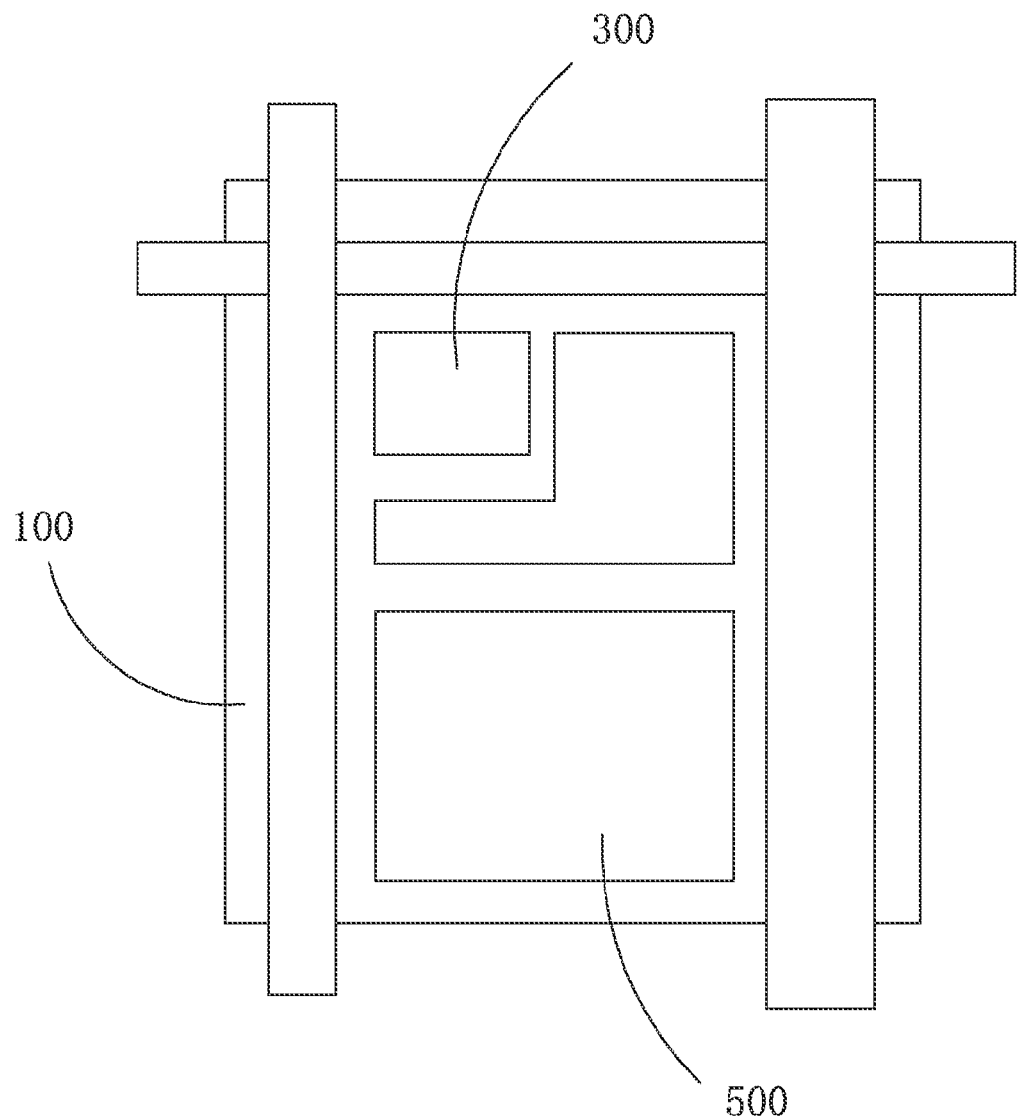
FIG. 2 is a top plan view of the active matrix organic light-emitting diode shown in FIG. 1.
Figure 3:
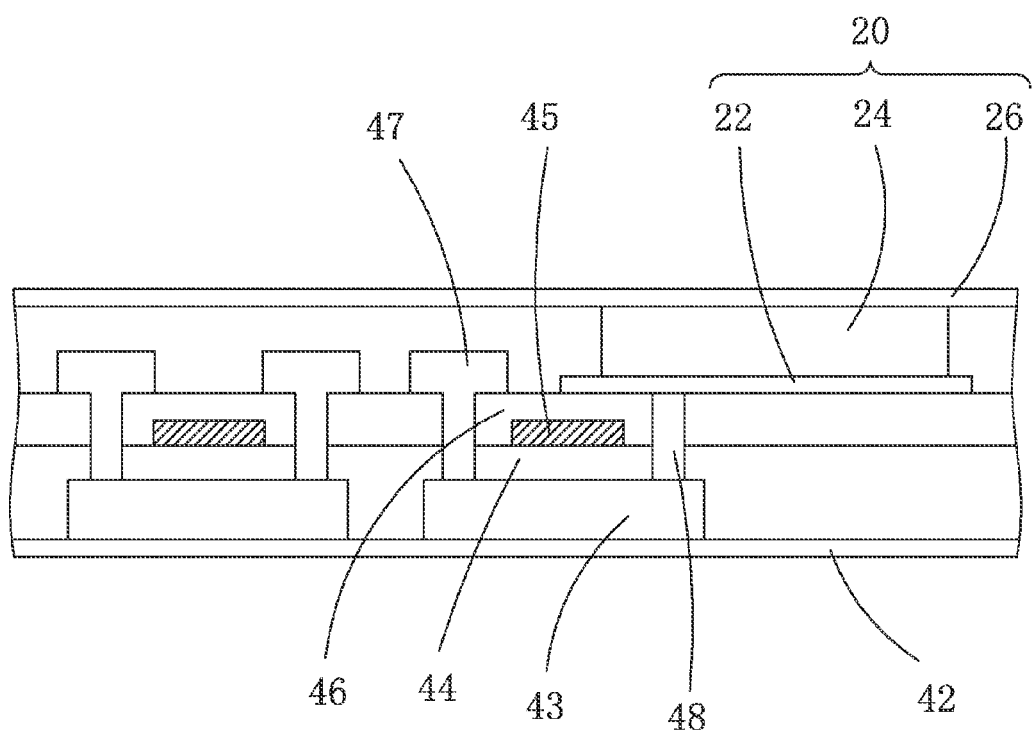
FIG. 3 is a schematic view showing the structure of a active matrix organic light-emitting diode according to the present invention.
Figure 4:
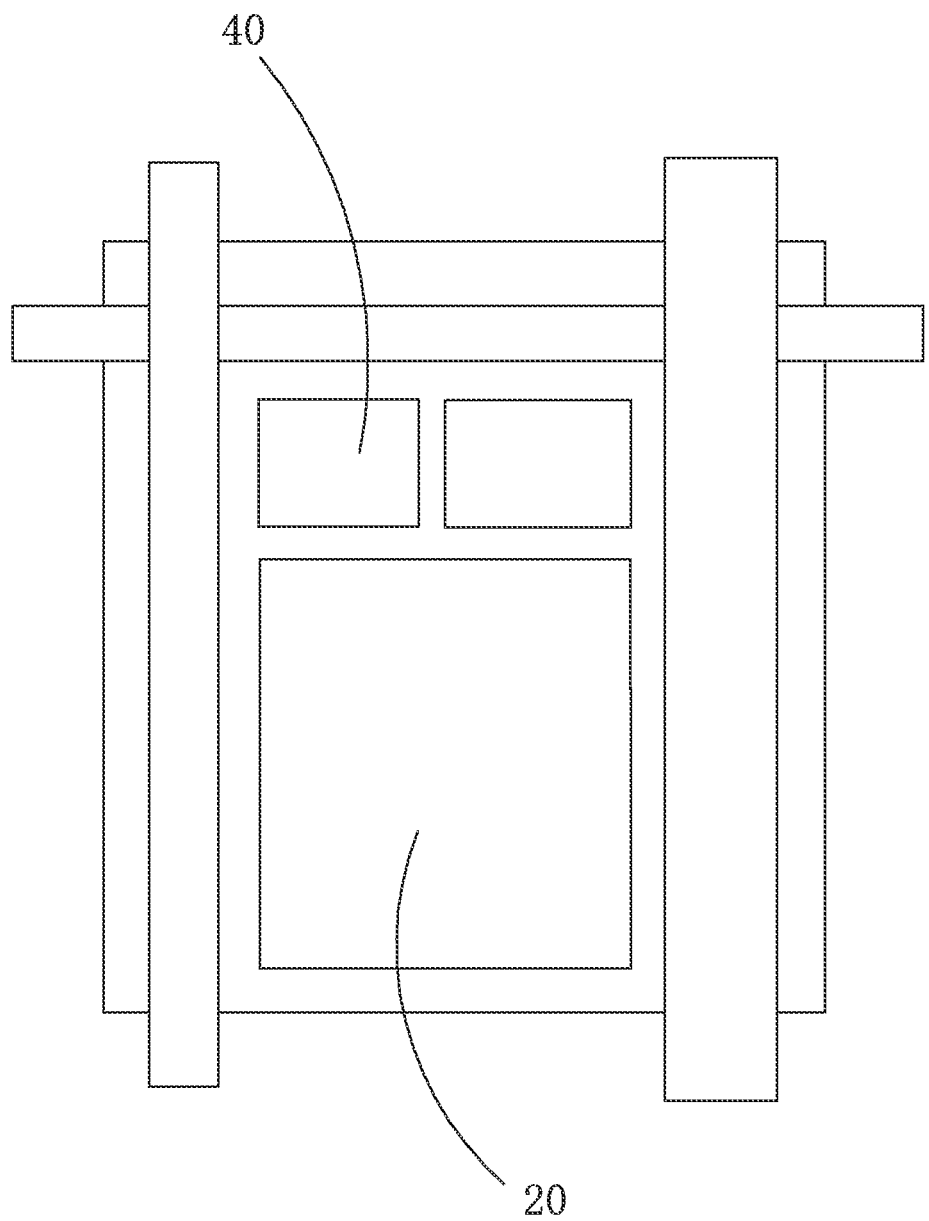
FIG. 4 is a top plan view of the active matrix organic light-emitting diode shown in FIG. 3.

Referring to FIGS. 3 and 4, the present invention provides an active matrix organic light-emitting diode, which comprises an organic light-emitting diode body 20 and a thin-film transistor 40 electrically connected to the organic light-emitting diode body 20. The organic light-emitting diode body 20 is arranged to be positioned above the thin-film transistor 40 in an alternate manner so as to enlarge the aperture ratio and improve quality of the active matrix organic light-emitting diode.

The thin-film transistor 40 is formed on a substrate 42 and comprises a semiconductor layer 43 formed on the substrate 42, a gate insulation layer 44 formed on the semiconductor layer 43, a gate terminal 45 formed on the gate insulation layer 44, a protection layer 46 formed on the gate terminal 45, and a source terminal 47 and a drain terminal 48 formed on the protection layer 46. The substrate 20 is a transparent substrate. In the instant embodiment, the substrate 20 is a glass or plastic substrate.

The light-emitting diode body 20 comprises an anode 22 formed on the protection layer 46 and electrically connected to the thin-film transistor 40, an organic light emission layer 24 formed on the anode 22, and a cathode 26 formed on the organic light emission layer 24. The organic light-emitting diode body 20 is arranged to be positioned above the thin-film transistor 40 in an alternate manner so as to allow the thin-film transistor 40 to provide active driving to the organic light-emitting diode body 20.

In the instant embodiment, the gate terminal 45 is formed of a first metal layer through a masking process. The source terminal 47 and the drain terminal 48 are formed of a second metal layer through a masking process. The anode 22 of the organic light-emitting diode body 20 is formed of a transparent conductive layer through a masking process. Preferably, the transparent conductive layer is an indium tin oxide (ITO) layer. The source terminal 47, the drain terminal 48, and the anode 22 of the organic light-emitting diode body 20 are formed with one masking process. The masking process comprises exposure, development, and etching operations. A specific way of forming the source terminal 47, the drain terminal 48, and the anode 22 of the organic light-emitting diode body 20 is that sequentially forming the transparent conductive layer and the second metal layer on the protection layer 46, applying one masking exposure operation, and the applying one yellow light etching operation to form the source terminal 47 and the drain terminal 48, and the applying again one yellow light etching operation to form the anode 22 of the organic light-emitting diode body 20. This way saves one masking process so as to effectively shorten the manufacturing time, lower down manufacturing cost, and save one insulation layer to further lower down the manufacturing cost.

Figure 5:
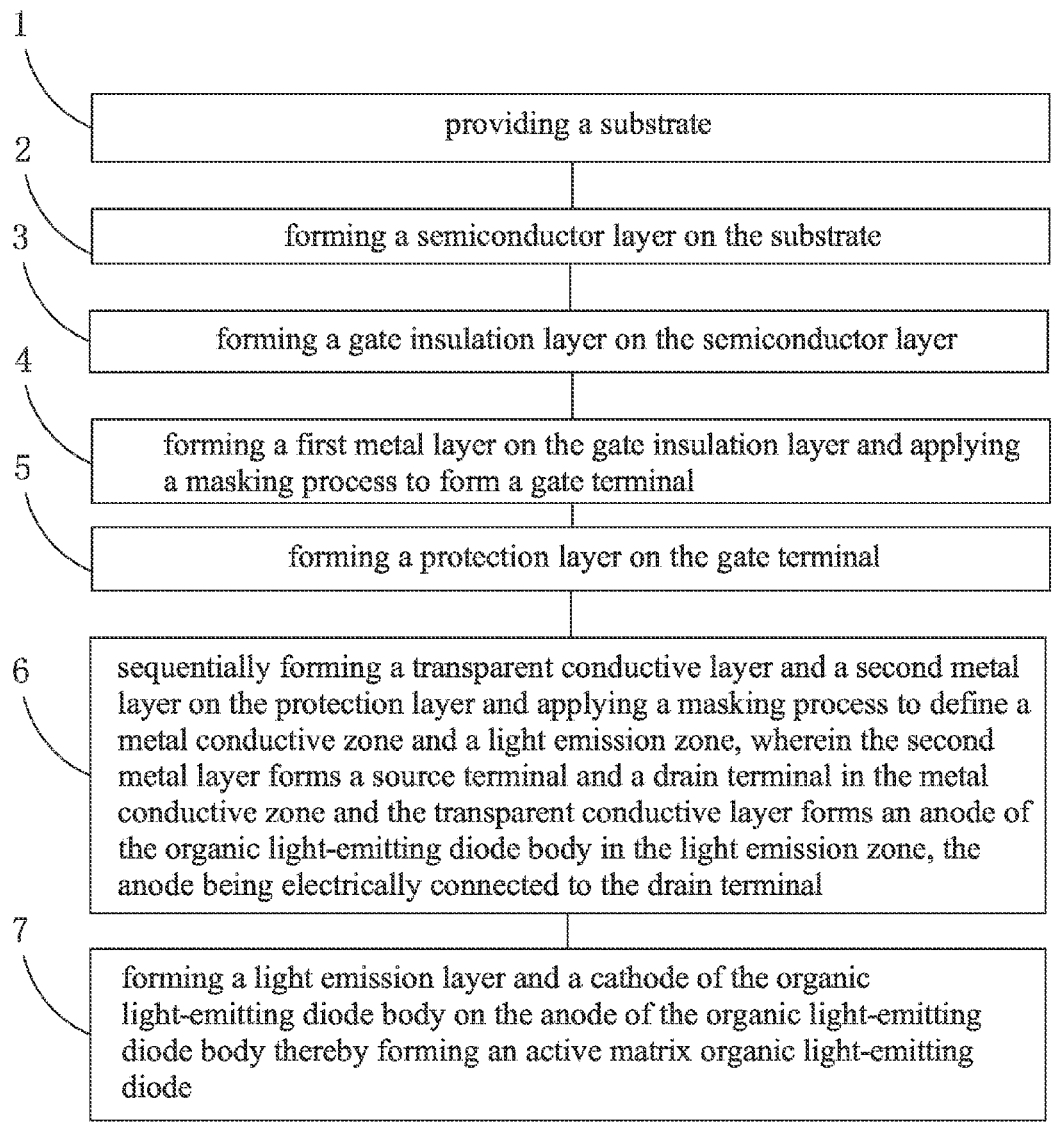
FIG. 5 is a flow chart illustrating a manufacturing method of an active matrix organic light-emitting diode according to the present invention.

Referring to FIG. 5, with additional reference to FIGS. 3 and 4, the present invention also provides a manufacturing method of an active matrix organic light-emitting diode, which comprises the following steps:

Step 1: providing a substrate 42.

The substrate 42 is a transparent substrate. In the instant embodiment, the substrate 20 is a glass or plastic substrate.

Step 2: forming a semiconductor layer 43 on the substrate 42.

An amorphous silicon layer is deposited on the substrate 42 through chemical vapor deposition and the amorphous silicon layer is converted into a polysilicon layer through an annealing operation. A predetermined pattern is formed on the polysilicon layer through a masking process so as to form the semiconductor layer 43.

The masking process comprises exposure, development, and etching operation, which can adopt any known techniques.

Step 3: forming a gate insulation layer 44 on the semiconductor layer 43.

The gate insulation layer 44 is a silicon oxide ($SiO_x$) layer or silicon nitride ($SiN_x$) layer, which is deposited on the semiconductor layer 43 through chemical vapor deposition.

Step 4: forming a first metal layer on the gate insulation layer 44 and applying a masking process to form a gate terminal 45.

The first metal layer comprises copper (Cu), aluminum (Al), molybdenum (Mo), titanium (Ti) or a laminated structure thereof.

Step 5: forming a protection layer 46 on the gate terminal 45.

Step 6: sequentially forming a transparent conductive layer and a second metal layer on the protection layer 46 and applying a masking process to define a metal conductive zone and a light emission zone, wherein the second metal layer forms a source terminal 47 and a drain terminal 48 and the transparent conductive layer forms an anode 22 of the organic light-emitting diode body 20 with the anode 22 being electrically connected to the drain terminal 48.

In the instant embodiment, the transparent conductive layer and the second metal layer are sequentially formed and are subjected to one masking exposure operation and further subjected to one yellow light etching operation to form the source terminal 47 and the drain terminal 48 thereby defining the metal conductive zone, and further subjected to yellow light etching operation one more time to form the anode 22 of the organic light-emitting diode body 20 thereby defining the light emission zone. Compared to the known techniques, the present invention saves one masking process so as to effectively shorten the manufacturing time, lower down manufacturing cost, and save one insulation layer to further lower down the manufacturing cost. The light emission zone is arranged to be positioned above the metal conductive zone in an alternate manner so as to effectively enlarge the aperture ratio and improve quality of the active matrix organic light-emitting diode.

The transparent conductive layer is an indium tin oxide (ITO) layer.

Step 7: forming a light emission layer 24 and a cathode 26 of the organic light-emitting diode body 20 on the anode 22 of the organic light-emitting diode body 20 thereby forming an active matrix organic light-emitting diode.

In summary, the present invention provides an active matrix organic light-emitting diode and a manufacturing method thereof, which carries out successive coating of a transparent conductive layer and a second metal layer and applies two masking processes to respectively form the source terminal and the drain terminal of TFT array and an anode of the organic light-emitting diode body, thereby defining a metal conductive zone and a light emission zone, whereby one insulation layer is saved, the number of masks used is reduced, the manufacturing efficiency of active matrix organic light-emitting diode is increased, and the manufacturing cost is reduced. Further, the aperture ratio is effectively enlarged so as to improve the quality of active matrix organic light-emitting diode.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A manufacturing method of an active matrix organic light-emitting diode, comprising the following steps:
   (1) providing a substrate;
   (2) forming a semiconductor layer on the substrate;
   (3) forming a gate insulation layer on the semiconductor layer;
   (4) forming a first metal layer on the gate insulation layer and applying a masking process to form a gate terminal;
   (5) forming a protection layer on the gate terminal;
   (6) sequentially forming a transparent conductive layer and a second metal layer on the protection layer, which are subjected to one masking operation and further subjected to one yellow light etching operation to form a source terminal and a drain terminal with the second metal layer thereby defining a metal conductive zone and further subjected to one additional yellow light etching operation to form an anode of the organic light-emitting diode body with the transparent conductive layer thereby defining a light emission zone, wherein the anode is electrically connected to the drain terminal; and
   (7) forming a light emission layer and a cathode of the organic light-emitting diode body on the anode of the organic light-emitting diode body thereby forming an active matrix organic light-emitting diode.

2. The manufacturing method of an active matrix organic light-emitting diode as claimed in claim 1, wherein the substrate comprises a glass or plastic substrate.

3. The manufacturing method of an active matrix organic light-emitting diode as claimed in claim 1, wherein the masking process comprises exposure, development, and etching operations.

4. The manufacturing method of an active matrix organic light-emitting diode as claimed in claim 1, wherein the transparent conductive layer comprises an indium tin oxide layer.

5. An active matrix organic light-emitting diode, comprising: an organic light-emitting diode body and a thin-film transistor electrically connected to the organic light-emitting diode body, the thin-film transistor being formed on a substrate and comprising a semiconductor layer formed on the substrate, a gate insulation layer formed on the semiconductor layer, a gate terminal formed on the gate insulation layer, a protection layer formed on the gate terminal, and a source terminal and a drain terminal formed on the protection layer through a masking process, the light-emitting diode body comprising an anode formed on the protection layer through the same masking process as the drain terminal to be in direct contact with the drain terminal so as to be electrically connected to the thin-film transistor, an organic light emission layer formed on the anode, and a cathode formed on the organic light emission layer, the organic light-emitting diode body being arranged to be positioned above the thin-film transistor in an alternate manner.

6. The active matrix organic light-emitting diode as claimed in claim 5, wherein the substrate comprises a glass or plastic substrate.

7. The active matrix organic light-emitting diode as claimed in claim 5, wherein the masking process comprises exposure, development, and etching operations.

8. The active matrix organic light-emitting diode as claimed in claim 5, wherein the gate terminal is formed of a first metal layer through a masking process, the source terminal and the drain terminal being formed of a second metal layer through a masking process, the anode of the organic light-emitting diode body being formed of a transparent conductive layer through a masking process.

9. The active matrix organic light-emitting diode as claimed in claim 8, wherein the transparent conductive layer comprises an indium tin oxide layer.

10. An active matrix organic light-emitting diode, comprising: an organic light-emitting diode body and a thin-film transistor electrically connected to the organic light-emitting diode body, the thin-film transistor being formed on a substrate and comprising a semiconductor layer formed on the substrate, a gate insulation layer formed on the semiconductor layer, a gate terminal formed on the gate insulation layer, a protection layer formed on the gate terminal, and a source terminal and a drain terminal formed on the protection layer through a masking process, the light-emitting diode body comprising an anode formed on the protection layer through the same masking process as the drain terminal to be in direct contact with the drain terminal so as to be electrically connected to the thin-film transistor, an organic light emission layer formed on the anode, and a cathode formed on the organic light emission layer, the organic light-emitting diode body being arranged to be positioned above the thin-film transistor in an alternate manner;

wherein the gate terminal is formed of a first metal layer through a masking process, the source terminal and the drain terminal being formed of a second metal layer through a masking process, the anode of the organic light-emitting diode body being formed of a transparent conductive layer through a masking process;

wherein the transparent conductive layer comprises an indium tin oxide layer;

wherein the substrate comprises a glass or plastic substrate; and wherein the masking process comprises exposure, development, and etching operations.

* * * * *